(12) United States Patent
Chung et al.

(10) Patent No.: US 10,879,827 B2
(45) Date of Patent: Dec. 29, 2020

(54) APPARATUS FOR REDUCING BELT SLIP

(71) Applicants: HYUNDAI MOTOR COMPANY, Seoul (KR); KIA MOTORS CORPORATION, Seoul (KR)

(72) Inventors: Tae Young Chung, Hwaseong-si (KR); Jun Mo An, Hwaseong-si (KR); Byung Hoon Yang, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 158 days.

(21) Appl. No.: 16/200,201

(22) Filed: Nov. 26, 2018

(65) Prior Publication Data
US 2019/0348939 A1 Nov. 14, 2019

(30) Foreign Application Priority Data
May 10, 2018 (KR) .................. 10-2018-0053564

(51) Int. Cl.
| | |
|---|---|
| *H02P 6/12* | (2006.01) |
| *H02P 23/08* | (2006.01) |
| *B60K 6/26* | (2007.10) |
| *B60W 20/00* | (2016.01) |
| *B60L 15/20* | (2006.01) |
| *H03H 21/00* | (2006.01) |
| *H02P 23/12* | (2006.01) |
| *F16H 7/02* | (2006.01) |

(52) U.S. Cl.
CPC .............. *H02P 23/08* (2013.01); *B60K 6/26* (2013.01); *B60L 15/20* (2013.01); *B60W 20/00* (2013.01); *H02P 23/12* (2013.01); *H03H 21/0043* (2013.01); *B60K 2006/268* (2013.01); *B60W 2710/083* (2013.01); *B60Y 2200/92* (2013.01); *F16H 7/02* (2013.01); *H03H 2021/0045* (2013.01); *H03H 2021/0049* (2013.01)

(58) Field of Classification Search
CPC ............. H02P 23/08; H02P 23/12; H02P 9/48
See application file for complete search history.

(56) References Cited

U.S. PATENT DOCUMENTS

2007/0233478 A1* 10/2007 Sakamoto ............ G10K 11/178
704/233
2015/0001773 A1* 1/2015 Inoue .................... F16F 15/022
267/140.15

FOREIGN PATENT DOCUMENTS

KR 10-2011-0045718 A 5/2011
KR 10-2012-0079904 A 7/2012

* cited by examiner

*Primary Examiner* — Karen Masih
(74) *Attorney, Agent, or Firm* — Morgan, Lewis & Bockius LLP

(57) ABSTRACT

An apparatus for reducing belt slip of a vehicle, in which the vehicle includes an engine as a vibration source and an electric motor connected to the engine through a belt to transmit torque of the engine, includes: a signal generator configured to generate a reference signal with a frequency corresponding to vibration of the engine; an adaptive filter configured to calculate a filter coefficient to remove an error value between a rotational speed of the engine and a rotational speed of the electric motor and apply the filter coefficient to the reference signal to generate a reference torque signal; and a torque compensator configured to generate a belt slip compensation torque signal by changing an amplitude of the reference torque signal, and apply the belt slip compensation torque signal to determine a final torque command of the electric motor.

11 Claims, 5 Drawing Sheets

APPARATUS FOR REDUCING BELT SLIP

CROSS REFERENCE TO RELATED APPLICATION

The present application claims priority to Korean Patent Application No. 10-2018-0053564, filed May 10, 2018, the entire contents of which is incorporated herein for all purposes by this reference.

TECHNICAL FIELD

The present disclosure relates generally to an apparatus for reducing belt slip. More particularly, the present disclosure relates to an apparatus for reducing belt slip, the apparatus capable of reducing slip due to engine vibration occurring in a belt provided for transmitting torque between an engine and a hybrid starter generator (HSG) as an electric motor in a hybrid vehicle or the like.

BACKGROUND

In general, a hybrid vehicle, which generates rotational force of a drive wheel with an engine driven by combustion of fossil fuel and an electric motor operated by electrical energy, determines whether to drive the engine considering various driving conditions and vehicle conditions.

In order to drive an engine in a hybrid vehicle, a separate start motor is required to start the engine, and a generator is required to convert rotational energy generated by the engine into electrical energy while the engine is running. In a hybrid vehicle, a hybrid starter generator (HSG), which serves as both a start motor and a generator, is provided, wherein a rotation shaft of the HSG and a rotation shaft of the engine are pulley coupled to each other through a belt.

To start driving the engine, the HSG operates as a motor to start the engine, and while the engine is running, the HSG operates as a generator that receives the rotational force of the engine through the belt and generates electrical energy.

In this belt connection structure applied to the hybrid vehicle, belt slip occurs when a load is applied to the belt due to the rotational vibration of the engine. The slip occurring in the belt not only may lead to the loss of torque transmission but also may cause deterioration in the durability of the belt.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and the present disclosure is intended to propose an apparatus for reducing belt slip, the apparatus capable of reducing or eliminating the slip occurring in a belt that pulley-couples an engine and a hybrid starter generator (HSG) in a hybrid vehicle through a control technique without addition of a physical mechanism.

In order to achieve the above object, an apparatus for reducing belt slip of a vehicle, in which the engine includes an engine as a vibration source and an electric motor connected to the engine through a belt to transmit torque of the engine, includes: a signal generator configured to generate a reference signal with a frequency corresponding to vibration of the engine causing the belt slip; an adaptive filter configured to calculate a filter coefficient to remove an error value between a rotational speed of the engine and a rotational speed of the electric motor and apply the filter coefficient to the reference signal to generate a reference torque signal to drive the electric motor; and a torque compensator configured to generate a belt slip compensation torque signal by changing an amplitude of the reference torque signal based on the torque of the engine, and apply the belt slip compensation torque signal to determine a final torque command of the electric motor.

The signal generator may determine the reference signal in consideration of a number of power strokes occurring within one rotational period of the engine, and a pulley ratio between a pulley coupled to a rotation shaft of the engine with the belt engaged therewith and a pulley coupled to a rotation shaft of the electric motor.

The signal generator may generate the reference signal as in Equation $[x(k)=\sin r_1 r_2 \theta_1]$ ($\theta_1$: a rotation angle of the engine, $r_1$l: the number of power strokes per one rotational period of the engine, and $r_2$: the pulley ratio).

The adaptive filter may be further configured to: calculate a filter coefficient to minimize an error value between actual speed of the engine and actual speed of the electric motor; and filter the reference signal by applying the filter coefficient to generate the reference torque signal of the electric motor with a vibration occurrence frequency by the power strokes of the engine reflected thereto.

The adaptive filter may calculate the filter coefficient to minimize the error value using a recursive least square (RLS) algorithm.

The adaptive filter may have a finite impulse response (FIR) format or an infinite impulse response (IIR) format.

The torque compensator may be configured to: change the amplitude of the reference torque signal by multiplying the reference torque signal of magnitude of 1 by a torque value corresponding to a magnitude of output torque of the engine to generate the belt slip compensation torque signal; and add the belt slip compensation torque signal to a torque command of the electric motor received from a separate controller to generate the final torque command of the electric motor.

The torque value corresponding to the magnitude of output torque of the engine may be actual output torque of the engine, a value obtained by multiplying the actual output torque by a predetermined proportional coefficient, or a value obtained by multiplying predetermined fixed engine torque by a predetermined proportional coefficient.

The apparatus may further include a phase compensator configured to compensate for a phase difference between actual speed of the engine and the reference signal.

The phase compensator may calculate speed of the electric motor by differentiating a rotation angle of the electric motor determined by applying a number of power strokes occurring within one rotational period of the engine, and a pulley ratio between a pulley coupled to a rotation shaft of the engine with the belt engaged therewith and a pulley coupled to a rotation shaft of the electric motor to a rotation angle of the engine, and calculate the phase difference based on the filter coefficient of the adaptive filter and the calculated speed of the electric motor to compensate the rotation angle of the electric motor for the phase difference.

The rotation angle ($\theta_2$) of the electric motor may be calculated by Equation $[\theta_2 = r_1 r_2 \theta_1]$ ($r_1$: the number of power strokes per one rotational period of the engine, and $r_2$: the pulley ratio), the speed ($\omega_2$) of electric motor may be determined as in Equation $[\omega_2 = r_1 r_2 \omega_1]$ ($\omega_1$: the speed of the engine) by differentiating both sides of the Equation [θ₂=r₁r₂θ₁], and the phase difference (α) may be determined by Equation $$\left[\alpha = \angle H(e^{j\omega T_s}) = \tan^{-1}\frac{-b_1\sin(\omega_2 T_s)}{b_0 + b_1\cos(\omega_2 T_s)}\right]$$

(($b_0$, $b_1$: the filter coefficient of the adaptive filter, and $T_s$: data acquisition time interval) (sampling time)).

According to the apparatus for reducing belt slip of the present disclosure, since a reference signal is generated to have a frequency and a phase corresponding to a vibration component of the engine, and the reference signal is applied to an adaptive filter with a filter coefficient that minimizes an error value corresponding to a difference between rotational speed of the engine and rotational speed of the HSG so as to derive a torque command of the HSG, it is possible to suppress the occurrence of slip due to engine vibration in the belt connecting the rotation shafts of the engine and the HSG to each other.

Particularly, according to the apparatus for reducing belt slip, since the belt slip can be suppressed by controlling the rotation of the motor without requiring a separate mechanism or changing a conventional device configuration, no additional costs are incurred.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Hereinbelow, an apparatus for reducing belt slip according to various embodiments of the present disclosure will be described in more detail with reference to the accompanying drawings.

Figure 1:
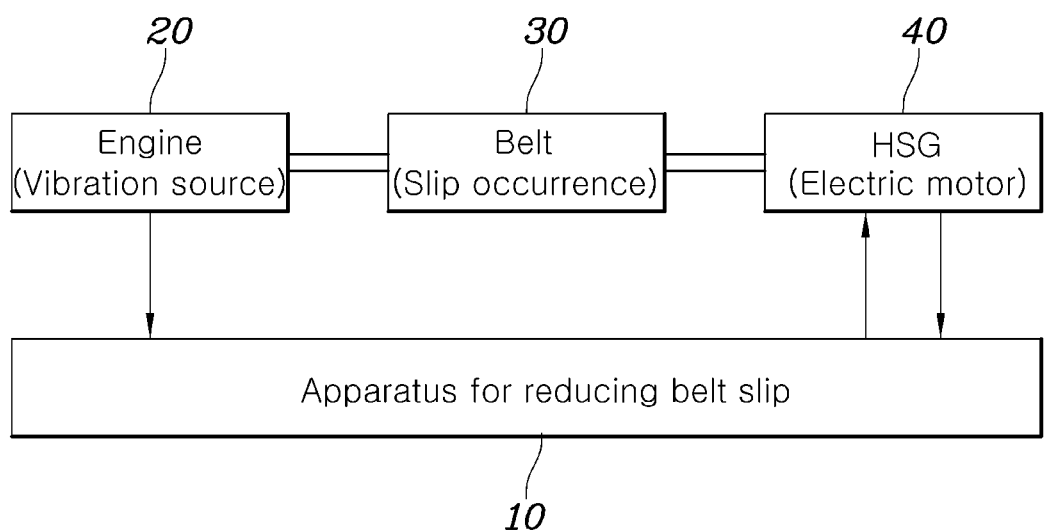
FIG. 1 is a block diagram showing a partial configuration of a hybrid vehicle to which an apparatus for reducing belt slip according to various embodiments of the present disclosure is applied.

FIG. 1 is a block diagram showing a partial configuration of a hybrid vehicle to which an apparatus for reducing belt slip according to various embodiments of the present disclosure is applied.

As shown in FIG. 1, a hybrid vehicle, to which an apparatus for reducing belt slip 10 according to various embodiments of the present disclosure is applied, may include: an engine 20 configured to burn fuel to produce power; and a hybrid starter generator (HSG) 40 configured to serve as an electric motor or a generator with a rotation shaft connected to a rotation shaft (crankshaft) of the engine 20 through a belt 30. In other words, the hybrid vehicle includes a structure where a pulley coupled to the rotation shaft of the engine 20 and a pulley connected to the rotation shaft of the HSG 40 are connected to each other through the belt 30 to transmit power mutually. Hereinafter, it should be understood that a vibration source means the engine 20 that generates vibration by generating a rotational force through explosion of fuel, and an electric motor refers to the HSG 40 having a rotation shaft belt-connected to the rotation shaft of the engine 20.

In this structure, the engine 20 is the vibration source that generates vibration due to the combustion-explosion of the fuel, whereby when the power is transmitted through the belt 30, the engine 20 transmits not only the rotational force due to the rotation shaft but also the vibration component. The vibration of the engine 20 causes slipping of the belt 30.

In various embodiments of the present disclosure, the apparatus for reducing belt slip 10 controls the HSG 40 to generate a rotation with the same frequency and phase as the vibration component included in the rotational speed of the rotation shaft of engine 20, thereby reducing slipping of the belt that connects the rotation shaft of engine 20 and the rotation shaft of HSG 40 together.

To be more specific, an embodiment of the present disclosure can be achieved using the frequency response characteristic of a system including the engine 20 as a vibration source, the HSG 40 as an electric motor, and the belt 30. By performing torque control of the electric motor such that the speed variation created by the electric motor is matched to the vibration component caused by the vibration source, the frequency, and the phase, it is possible to reduce the slipping of the belt between the vibration source and the electric motor by the vibration component. Since the frequency and shape (waveform) of the vibration source causing the belt slip can be known in advance, if a reference signal to be a reference of output torque of the electric motor is determined to have a shape matched to the frequency of the vibration source, the two speeds have the same waveform of the same frequency with the difference in phase and magnitude.

If the speed of the vibration source is a target signal, the reference signal of the electric motor is an input signal, and an adaptive filter is configured to minimize an error between the speed of the vibration source and the speed of the electric motor, it is possible to calculate a phase difference in the frequency domain by using a filter coefficient that minimizes the error so as to determine the output torque of the electric motor, or it is possible to determine the output torque of the electric motor by using a filter output that minimizes the error.

Figure 2:
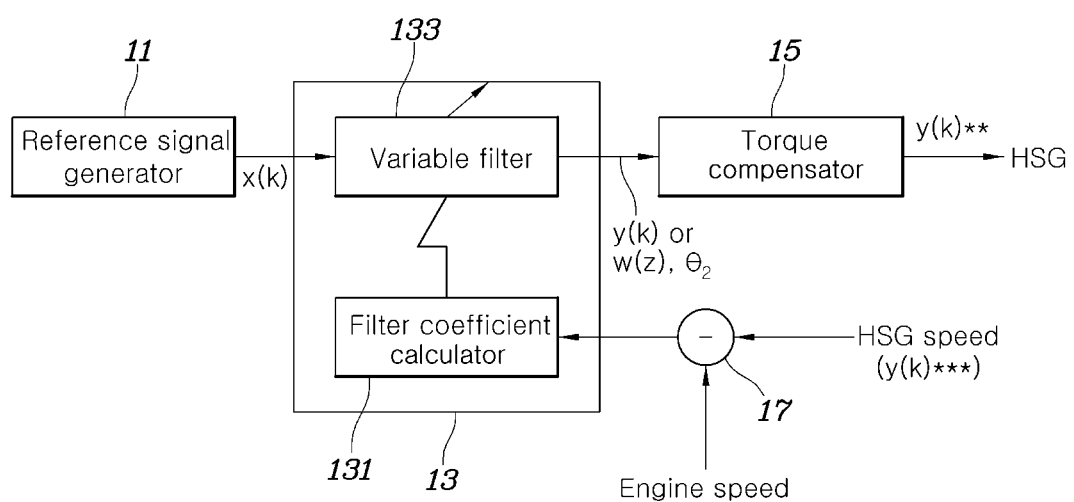
FIG. 2 is a block diagram showing an apparatus for reducing belt slip according to an embodiment of the present disclosure.

FIG. 2 is a block diagram showing an apparatus for reducing belt slip according to an embodiment of the present disclosure.

Referring to FIG. 2, the apparatus for reducing belt slip according to an embodiment of the present disclosure may include a reference signal generator 11, an adaptive filter 13, and a torque compensator 15. In the present disclosure, the apparatus for reducing belt slip maybe a control system managing, commanding, or regulating the behavior of devices or systems using control loops. Here, a feedback controller may be used to automatically control a process or operation.

In the present disclosure, the reference signal generator 11 may be an electronic device that generates repeating or non-repeating electronic signals in either the analog or the digital domain, the adaptive filter 13 may be a system with a linear filter that has a transfer function controlled by variable parameters, and the torque compensator 15 may be a component used in a control system for improving a signal response in a feedback and control system.

The reference signal generator 11 generates a unit sine wave reference signal of magnitude of 1 by reflecting the ratio of the vibration period of the engine 20, and the ratio between a pulley coupled to the rotation shaft of the engine 20 and a pulley coupled to the rotation shaft of the HSG 40 to a rotational position of the HSG 40 such that the HSG 40 as the electric motor generates a signal with the same frequency as the vibration included in the rotational speed of the engine 20 as the vibration source.

For example, assuming that the rotation angle of the engine 20 as the vibration source is $\theta_1$, the rotation angle $\theta_2$ of the HSG 40 is given by the following Equation 1, considering the vibration period and the pulley ratio included in the rotational speed of the engine 20.

$$\theta_2 = r_1 r_2 \theta_1 \qquad \text{[Equation 1]}$$

In the Equation 1, $r_1$ refers to the number of vibrations (power strokes) per one rotational period of the engine 20, and $r_2$ refers to the pulley ratio between pulleys respectively connected to the rotation shafts of the engine 20 and the HSG 40 through the belt.

The unit sine wave reference signal of magnitude of 1 is generated by using the Equation 1, as in the following Equation 2.

$$x(k) = \sin r_1 r_2 \theta_1 \qquad \text{[Equation 2]}$$

In the Equation 1, refers to the number of fuel explosions in the engine that occurs during one revolution of the rotation shaft of the engine. For example, if the engine 20 is a four-cylinder four-stroke internal combustion engine, $r_1$ is two because two explosions occur each time one revolution is performed mechanically.

The reference signal generator 11 may be configured to input the ratio of the vibration period of the engine 20, and the ratio between the pulley coupled to the rotation shaft of the engine 20 and the pulley coupled to the rotation shaft of the HSG 40 into the rotational position of the HSG 40, and an output (that is, the reference signal) corresponding to the input is implemented in the form of a predetermined map.

As another method of calculating the reference signal, an electric angle change of a position signal of the electric motor may be divided considering the pulley ratio between the vibration source and the electric motor along with the ratio of the vibration frequency to the fundamental rotation frequency rotation frequency of the vibration source mentioned above, and a sin may be applied to the position angle, thereby calculating the reference signal.

The adaptive filter 13 sets a filter coefficient that minimizes (for example, 0) the error value of the speed y(k)* of the HSG 40 controlled based on speed d(k) of engine 20 and the reference signal x(k), and filters the reference signal generated in the reference signal generator 11** by using the set filter coefficient.

The adaptive filter 13 may include a filter coefficient calculator 131 and a variable filter 133.

The filter coefficient calculator 131 may receive an error value output from a subtractor 17 for calculating the difference between the actual engine speed d(k) and the actual HSG speed y(k)***, and calculate the filter coefficient w(z)–$b_0$, $b_1$ to minimize the received error value by using a recursive least square (RLS) algorithm.

The variable filter 133 may filer the reference signal x(k) by applying the filter coefficient calculated in the filter coefficient calculator 131. The variable filter 133 may be a finite impulse response (FIR) filter or an infinite impulse response (IIR) filter.

If the variable filter 133 is implemented as the FIR filter, the output is given by the following Equation 3.

$$y(k) = H(z) \times (k), H(z) = b_1 z^{-1} + b_0 \qquad \text{[Equation 3]}$$

In the Equation 3, H(z) is the FIR filter, and $b_0$ and $b_1$ are filter coefficients determined in the filter coefficient calculator 131. Further, in the Equation 3, the variable filter 133 is implemented as a first-order variable filter, but the order of the variable filter 133 may be a second-order or higher order as needed.

The reference signal x(k) is filtered by applying the filter coefficient calculated in the filter coefficient calculator 131, so that the signal y(k) output from the variable filter 133 can be a reference torque signal (magnitude of 1) of the electric motor, in which the error value between the engine speed d(k) and the HSG speed y(k)*** is minimized. The reference torque signal is a kind of torque command that can control the torque of the HSG considering the vibration generated by the engine, a vibration occurrence period (or a vibration occurrence frequency) is applied thereto, and the reason for the name reference torque signal is that the magnitude thereof is unit magnitude of 1.

The torque compensator 15 adjusts the magnitude of the reference torque signal y(k) output from the adaptive filter 13 based on engine torque Te, and adds the torque command of the HSG 40 calculated in a separate controller to the adjusted reference torque signal y(k)*, thereby generating a final torque command y(k) of the HSG 40**.

Figure 3:
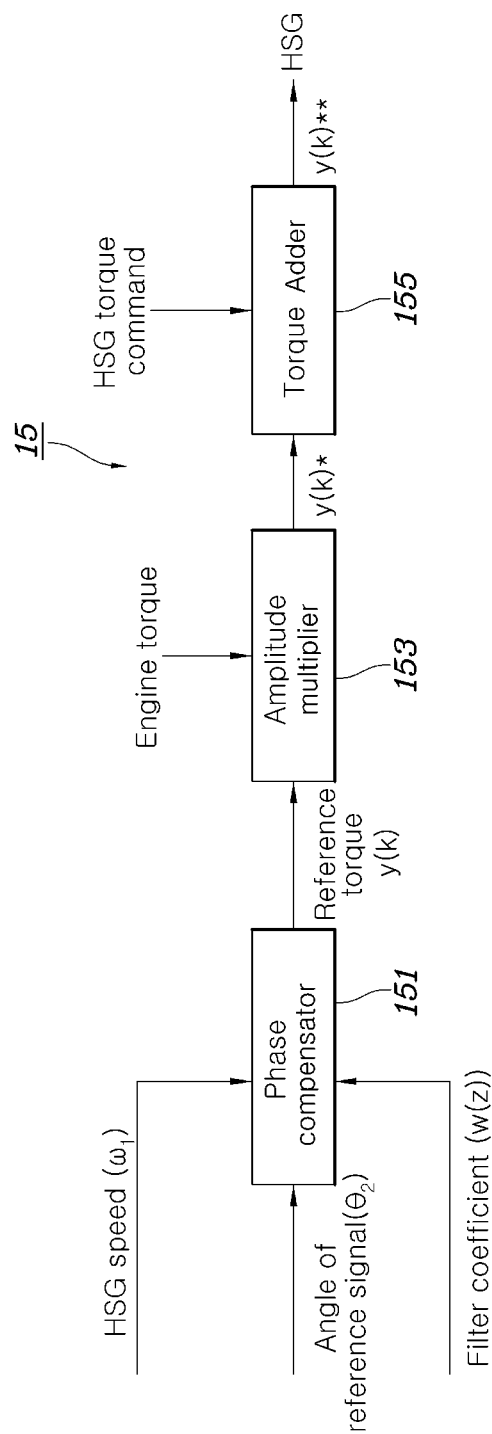
FIG. 3 is a detailed block diagram showing an example of a torque compensator applied to the apparatus for reducing belt slip according to an embodiment of the present disclosure.
Figure 4:
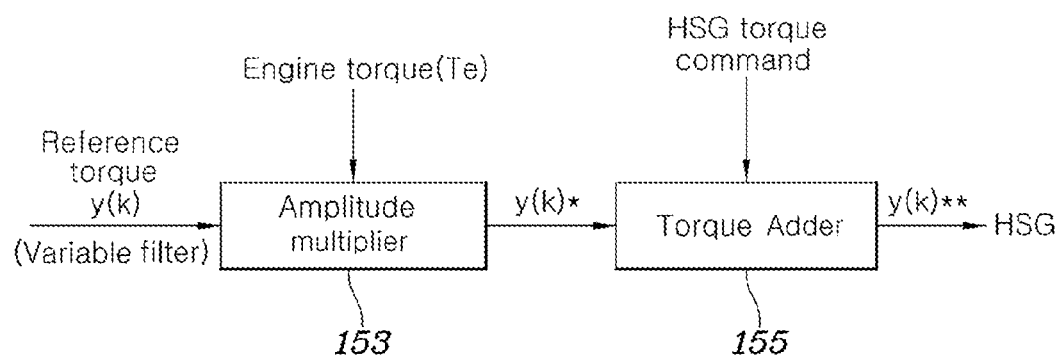
FIG. 4 is a detailed block diagram showing another example of the torque compensator applied to the apparatus for reducing belt slip according to an embodiment of the present disclosure.

FIGS. 3 and 4 are detailed block diagrams showing examples of a torque compensator applied to the apparatus for reducing belt slip according to various embodiments of the present disclosure.

Firstly, referring to FIG. 3, the torque compensator 15 of the apparatus for reducing belt slip according to an embodiment of the present disclosure may further include an amplitude multiplier 153, and a torque adder 155.

The amplitude multiplier 153 multiplies the reference torque signal y(k) by a torque value Te corresponding to a magnitude of the output torque of the engine, thereby generating the belt slip compensation torque signal y(k)* for reducing the belt slip. In other words, the amplitude multiplier 153 generates the belt slip compensation torque signal y(k)* by converting amplitude of the reference torque signal y(k) of magnitude of 1 to a level corresponding to the motor torque.

The torque value Te corresponding to the magnitude of the output torque of the engine multiplied by the reference torque signal y(k) in the amplitude multiplier 153 may be the real-time output torque of the engine, a value obtained by multiplying the real-time output torque of the engine by a predetermined proportional coefficient β, or a value obtained by multiplying predetermined fixed engine torque by the proportional coefficient β.

The torque adder 155 adds a torque command of the HSG 40 received from a separate controller to the belt slip compensation torque signal y(k)* calculated in the amplitude multiplier 153, thereby finally determining torque of the HSG 40.

The signal output from the amplitude multiplier 153 is the belt slip compensation torque signal y(k)*. In other words, the belt slip compensation torque signal y(k)* output from the amplitude multiplier 153 is the torque required to compensate for the belt slip due to the vibration caused by the explosion of the engine. The torque command of the HSG 40 can be provided to the HSG 40 by a separate controller (for example, a hybrid control unit (HCU)) for the starter and generator functions of the vehicle, which is the original function of the HSG 40.

Accordingly, to control the HSG 40 to perform its original function, the torque adder 155 generates a final torque command y(k) for controlling the HSG 40 by combining the torque command determined in the separate controller with the belt slip compensation torque signal as described above, and transmits the same to the HSG 40**.

The rotation of the HSG 40 is controlled by the final torque command y(k). Here, a rotor position of the HSG 40 may be detected by a rotation angle detector (not shown) provided in the HSG 40, and the rotational speed y(k)* of the HSG 40 may be derived by differentiating the detected rotor position.

The error value corresponding to the difference between the rotational speed d(k) of the engine and the rotational speed y(k)* of the HSG 40 may be calculated by the subtractor 17, and the error value is provided to the filter coefficient calculator 131** described above so that a filter coefficient (which can converge to zero) capable of minimizing the error value may be calculated.

As described above, the embodiment of the present disclosure is configured such that the HSG is controlled by deriving the torque command capable of minimizing the error value corresponding to the difference between the rotational speed d(k) of the engine and the rotational speed y(k)* of the HSG 40**, whereby it is possible to suppress the occurrence of slipping of the belt connecting the rotation shafts of the engine and the HSG to each other.

Particularly, the embodiment of the present disclosure is configured such that the belt slip is suppressed by controlling the rotation of the motor without requiring a separate mechanism or changing a conventional device configuration, whereby no additional costs are incurred.

The embodiment shown in FIG. 4 is different from the embodiment shown in FIG. 3 in that the torque compensator 15 further includes a phase compensator 151. In FIG. 4, the phase compensator 151 is shown as belonging to the torque compensator 15, but in actual implementation, the phase compensator 151 may be implemented separately from the torque compensator 15 or may be implemented in an adaptive filter.

The embodiment of FIG. 4 further includes the phase compensator 151. The phase compensator 151 is provided to compensate for a phase difference between the engine speed d(k) and the reference signal x(k) calculated in the reference signal generator 11 with the same frequency as the vibration component caused by the explosion of the engine. The embodiment of FIG. 4 is capable of controlling the engine speed causing the belt slip and the motor speed compensating the same to occur more precisely on the same phase by compensating for the phase difference between the engine speed d(k) and the reference signal x(k).

To compensate for the belt slip, the phase compensator 151 differentiates the rotation angle $\theta_2$ of the HSG 40 with respect to the reference signal generated in the reference signal generator 11, and calculates a speed signal as in Equation 4. Based on the speed signal and a coefficient determined by the filter coefficient calculator 131, the phase difference between the reference signal generated in the reference signal generator 11 and the speed of the engine 20 is given by the following Equation 5.

$$\omega_2 = r_1 r_2 \omega_1 \qquad \text{[Equation 4]}$$

$$\alpha = \angle H(e^{j\omega T_s}) = \tan^{-1} \frac{-b_1 \sin(\omega_2 T_s)}{b_0 + b_1 \cos(\omega_2 T_s)} \qquad \text{[Equation 5]}$$

In the Equation 4 and the Equation 5, ω refers to the rotational speed (speed signal) calculated by differentiating the rotation angle, α refers to the phase difference, and $T_s$ refers to the data acquisition time interval for phase compensation calculation, i.e., the sampling time.

The phase compensator 151 generates the reference torque signal y(k) by reflecting the phase difference shown in Equation 5. In other words, in the embodiment shown in FIG. 3, the reference torque signal y(k) is calculated by using a reference signal, 'x(k)=sinθ$_2$', but in the embodiment of FIG. 4, the reference torque signal y(k) may be determined by using a reference signal with phase compensation, 'x(k)=sin (θ$_2$+α)'.

The amplitude multiplier 153 and the torque adder 155 shown in FIG. 4 have the same configurations as those described with reference to FIG. 3, and their operations are also the same, so a duplicated description will be omitted.

Figure 5:
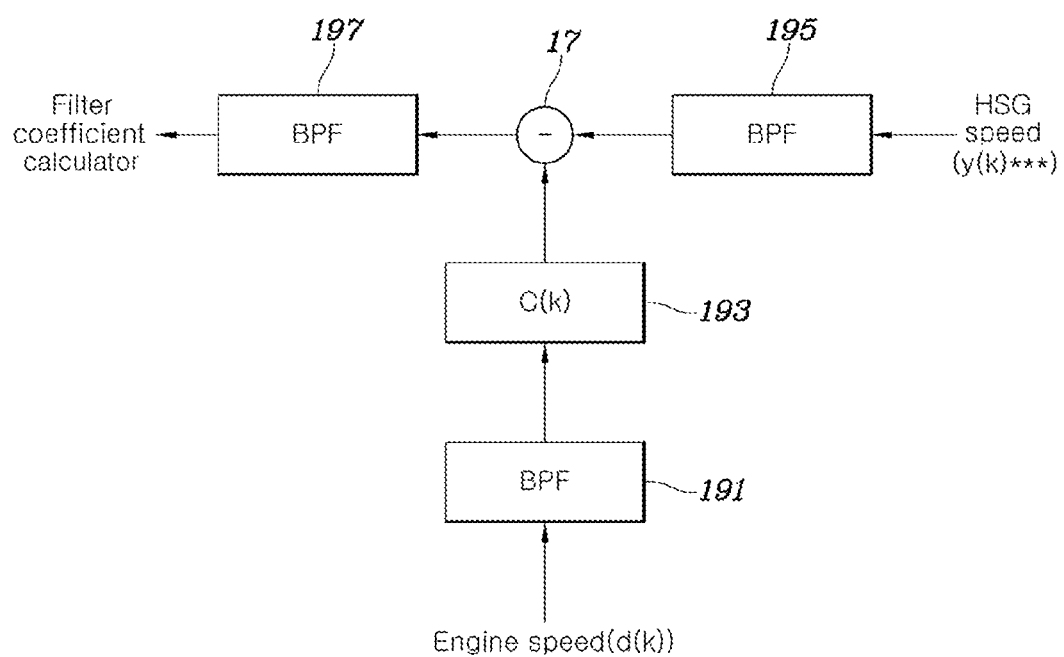
FIG. 5 is a block diagram showing a signal transfer structure of an apparatus for reducing belt slip according to various embodiments of the present disclosure.

FIG. 5 is a block diagram showing a signal transfer structure of an apparatus for reducing belt slip according to various embodiments of the present disclosure.

The elements shown in FIG. 5 may be variously added for more accurate signal transmission in the course of signal transmission shown in FIG. 2.

For example, a band-pass filter (BPF) 191, 195 is capable of only passing frequencies in a band corresponding to the vibration of the engine causing slip in the engine speed signal d(k) input to the subtractor 17 and the speed signal y(k)* of the HSG 40, respectively, to calculate the error value. This allows the error value calculated by the subtractor 17** to be calculated more accurately in the frequency band where the belt slip occurs.

Further, a band-pass filter (BPF) 197 is capable of only passing frequencies in a band corresponding to the vibration of the engine causing slip in the signal representing the error value calculated in the subtractor 17 to provide the same to the filter coefficient calculator 131. The BPF 197 also allows the error value corresponding to the frequency band, in which the belt slip occurs, to be provided to the filter coefficient calculator 131, whereby it possible to generate the filter coefficient of the filter coefficient calculator 131 more precisely.

Further, in the case where the transfer function by the belt system is required to be considered when calculating the difference between engine speed and HSG speed for the calculation of belt slip, an additional phase compensator 193 applies a predetermined additional phase compensation formula C(k) for additional phase compensation, whereby it is possible to more precisely match the engine vibration and the drive phase of the HSG suppressing the engine vibration.

In the above description, specific elements for detecting rotation angles of the engine or the HSG (electric motor), for deriving rotational speed from the detected rotation angle, or for detecting the torque of the engine have been omitted, but it can be easily implemented by various detection means and calculation techniques known in the art.

Although the exemplary embodiment of the present disclosure has been described for illustrative purposes, those skilled in the art will appreciate that various modifications, additions and substitutions are possible, without departing from the scope and spirit of the invention as disclosed in the accompanying claims.

What is claimed is:

1. An apparatus for reducing belt slip of a vehicle, in which the vehicle includes an engine as a vibration source and an electric motor connected to the engine through a belt to transmit a torque of the engine, the apparatus comprising:
a signal generator configured to generate a reference signal with a frequency corresponding to vibration of the engine causing the belt slip;
an adaptive filter configured to:
calculate a filter coefficient to remove an error value between a rotational speed of the engine and a rotational speed of the electric motor, and
apply the calculated filter coefficient to the reference signal to generate a reference torque signal to drive the electric motor, and
a torque compensator configured to:
generate a belt slip compensation torque signal by changing an amplitude of the reference torque signal based on the torque of the engine, and
apply the belt slip compensation torque signal to determine a final torque command of the electric motor.

2. The apparatus of claim 1, wherein the signal generator determines the reference signal based on a number of power strokes occurring within one rotational period of the engine, and a pulley ratio between a pulley coupled to a rotation shaft of the engine with the belt engaged the engine and a pulley coupled to a rotation shaft of the electric motor.

3. The apparatus of claim 2, wherein the signal generator generates the reference signal using the following equation:

$$[x(k)=\sin r_1 r_2 \theta_1],$$

wherein $\theta_1$ is a rotation angle of the engine, $r_1$ is the number of power strokes per one rotational period of the engine, and $r_2$ is the pulley ratio.

4. The apparatus of claim 1, wherein the adaptive filter is further configured to:
calculate a filter coefficient to minimize an error value between an actual speed of the engine and an actual speed of the electric motor, and
filter the reference signal by applying the filter coefficient to generate the reference torque signal of the electric motor with a vibration occurrence frequency by the power strokes of the engine reflected to the electric motor.

5. The apparatus of claim 4, wherein the adaptive filter calculates the filter coefficient to minimize the error value using a recursive least square (RLS) algorithm.

6. The apparatus of claim 4, wherein the adaptive filter has a finite impulse response (FIR) format or an infinite impulse response (IIR) format.

7. The apparatus of claim 1, wherein the torque compensator is further configured to:
change the amplitude of the reference torque signal by multiplying the reference torque signal of magnitude of 1 by a torque value corresponding to a magnitude of the torque of the engine to generate the belt slip compensation torque signal, and
add the belt slip compensation torque signal to a torque command of the electric motor received from a separate controller to generate the final torque command of the electric motor.

8. The apparatus of claim 7, wherein the torque value corresponding to the magnitude of the output torque of the engine is an actual output torque of the engine, a value obtained by multiplying the actual output torque by a predetermined proportional coefficient, or a value obtained by multiplying a predetermined fixed engine torque by a predetermined proportional coefficient.

9. The apparatus of claim 1, further comprising a phase compensator configured to compensate for a phase difference between an actual speed of the engine and the reference signal.

10. The apparatus of claim 9, wherein the phase compensator:
calculates a speed of the electric motor by differentiating a rotation angle of the electric motor determined by applying a number of power strokes occurring within one rotational period of the engine, and a pulley ratio between a pulley coupled to a rotation shaft of the engine with the belt engaged with the engine and a pulley coupled to a rotation shaft of the electric motor to a rotation angle of the engine, and
calculates the phase difference based on the filter coefficient of the adaptive filter and the calculated speed of the electric motor to compensate the rotation angle of the electric motor for the phase difference.

11. The apparatus of claim 10, wherein the rotation angle ($\theta_2$) of the electric motor is calculated by the following equation:

$$\theta_2 = r_1 r_2 \theta_1,$$

wherein $r_1$ is the number of power strokes per one rotational period of the engine, and $r_2$ is the pulley ratio,
wherein the speed ($\omega_2$) of electric motor is determined by differentiating the equation $\theta_2 = r_1 r_2 \theta_1$, as in the following equation:

$$\omega_2 = r_1 r_2 \omega_1,$$

wherein $\omega_1$ is the speed of the engine, and
wherein the phase difference ($\alpha$) is determined by the following equation $$\alpha = \angle H(e^{j\omega T_s}) = \tan^{-1} \frac{-b_1 \sin(\omega_2 T_s)}{b_0 + b_1 \cos(\omega_2 T_s)},$$

wherein $b_0$, $b_1$ are filter coefficients of the adaptive filter and $T_s$ is a data acquisition time interval.

* * * * *